United States Patent
Vikas Lalwani et al.

(10) Patent No.: US 11,940,505 B2
(45) Date of Patent: Mar. 26, 2024

(54) OMEGA AND THETA—A METHOD TO MEASURE MAGNETIC FIELD AT AC FREQUENCIES WITHOUT USING CURRENT SPINNING

(71) Applicant: The Board of Trustees of the Leland Stanford Junior University, Stanford, CA (US)

(72) Inventors: Anand Vikas Lalwani, Palo Alto, CA (US); Ananth Saran Yalamarthy, Mountain View, CA (US); Maximillian Holliday, Santa Fe, NM (US); Hannah Alpert, Sunnyvale, CA (US); Carla Nicole Pinzon, Stanford, CA (US); Debbie G. Senesky, Oakland, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 17/827,428

(22) Filed: May 27, 2022

(65) Prior Publication Data
US 2022/0390532 A1      Dec. 8, 2022

Related U.S. Application Data

(60) Provisional application No. 63/194,591, filed on May 28, 2021.

(51) Int. Cl.
*G01R 33/07*  (2006.01)
*G01D 5/14*  (2006.01)
*G01R 33/00*  (2006.01)

(52) U.S. Cl.
CPC .............. *G01R 33/07* (2013.01); *G01D 5/145* (2013.01); *G01R 33/0029* (2013.01)

(58) Field of Classification Search
CPC ..... G01R 33/0029; G01R 33/07; G01D 5/145
See application file for complete search history.

(56) References Cited

U.S. PATENT DOCUMENTS

| | | | |
|---|---|---|---|
| 3,223,924 A | 12/1965 | Wieder | |
| 3,546,578 A | 12/1970 | Sisson | |
| 7,923,996 B2 | 4/2011 | Doogue | |
| 10,809,313 B2* | 10/2020 | Stahl-Offergeld | ........................... G01R 33/0017 |
| 11,163,019 B1* | 11/2021 | Chaware | ............ G01R 33/0041 |
| 2013/0278252 A1 | 10/2013 | Sasaki | |
| 2018/0234041 A1 | 8/2018 | Sun | |
| 2020/0348372 A1 | 11/2020 | Yalamarthy | |
| 2022/0244322 A1* | 8/2022 | Motz | ...................... G01R 33/07 |

* cited by examiner

*Primary Examiner* — Reena Aurora
(74) *Attorney, Agent, or Firm* — LUMEN PATENT FIRM

(57) ABSTRACT

We use the AC Hall effect to characterize a magnetic field at an unknown frequency (or frequencies). The current to the Hall sensor is driven at a known frequency f. The output Hall voltage is characterized in a frequency range from f1 to f2 (with f<f1<f2 and f2−f1<2f). This provides a measurement of the magnetic field in a frequency range from f1−f to f2−f. The resulting measurement of magnetic field spectral components is phase-independent and requires no prior knowledge of exact magnetic field frequency.

5 Claims, 7 Drawing Sheets

Hall signal magnetic field

OMEGA AND THETA—A METHOD TO MEASURE MAGNETIC FIELD AT AC FREQUENCIES WITHOUT USING CURRENT SPINNING

CROSS REFERENCE TO RELATED APPLICATIONS

This application claims priority from US Provisional Patent Application 63/194,591 filed May 28, 2021, which is incorporated herein by reference.

GOVERNMENT SPONSORSHIP

None.

FIELD OF THE INVENTION

This invention relates to Hall effect sensors for time-varying magnetic fields at unknown frequencies.

BACKGROUND

AC magnetic field measurements using currently available Hall effect sensors often require complex switching circuitry to mitigate the offset present in measurements. The added set of transistors for switching have fundamental limits as to which frequency they can measure and they also take up valuable space on small boards/chips. Furthermore, a time varying magnetic field can also create an induced signal in Hall effect sensors. Accordingly, it would be an advance in the art to provide improved suppression of the parasitic offset and induced signals in Hall effect measurements.

SUMMARY

Measuring magnetic fields in AC applications (such as transformers, inverters, motor controllers, turbines) requires high frequency measurement. Conventional Hall effect devices are fundamentally limited by current spinning. We have developed a method to measure magnetic field at any frequency without current spinning.

In previous work by some of the present inventors (US2020/0348372, hereby incorporated by reference in its entirety) the Hall effect at the second harmonic was exploited. In that work, the harmonic signal driving the Hall effect device had to match exactly the frequency of the external magnetic field in order to provide a Hall signal at twice that frequency. Furthermore this technique is also sensitive to the phase difference between the magnetic field and the current driving the Hall sensor. Such phase sensitivity is often highly undesirable.

The main idea of this work is to use the AC Hall effect to characterize a magnetic field at an unknown frequency (or frequencies). The current to the Hall sensor is driven at a known frequency f. The output Hall voltage is characterized in a frequency range from f1 to f2 (with f<f1<f2 and f2−f1<2f). This provides a measurement of the magnetic field in a frequency range from f1−f to f2−f. The resulting measurement of magnetic field spectral components is phase-independent and requires no prior knowledge of exact magnetic field frequency.

An advantage of this new approach is that it does not require the frequencies to have an exact match. For example, if the magnetic field frequency is at 800 Hz, we can drive the signal at a suitable frequency (e.g., 2000 Hz), and measure the signal without offset or induced noise at 2800 Hz. In other words, because the current frequency is at 2000 Hz, measuring the Hall voltage at 2800 Hz is a measurement of the magnetic field at the difference frequency of 800 Hz. The technique is proven to be more accurate and cost effective than current spinning Requiring the frequencies to have an exact match is limiting in applications. The current method overcomes the limitation and has the advantage of measuring any magnetic field frequency, without having to worry about phase-matching or frequency matching, allowing for broader applications.

DETAILED DESCRIPTION

A) General Principles

Figure 1:
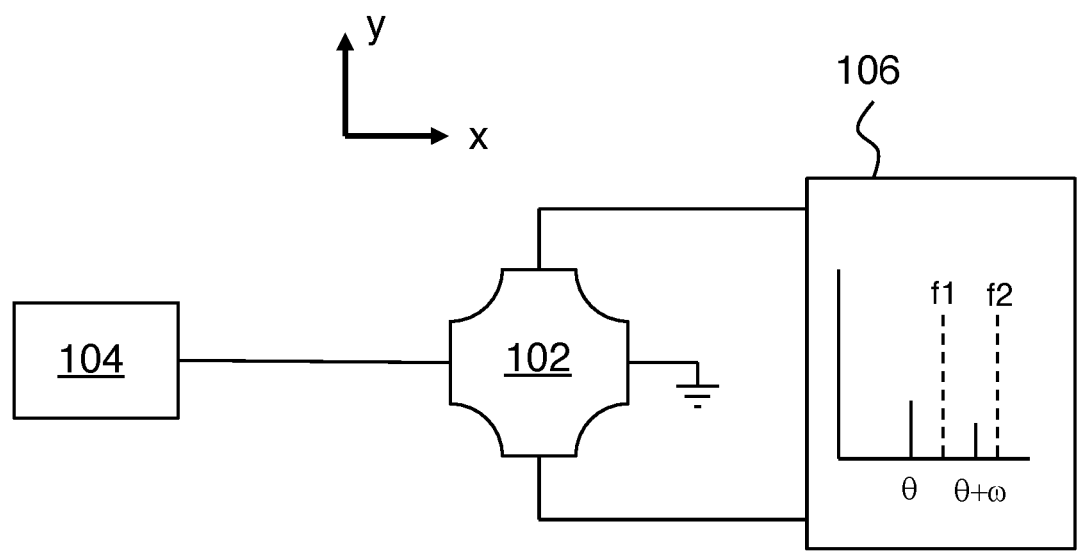
FIG. 1 shows an exemplary embodiment of the invention.

FIG. 1 shows an exemplary embodiment of the invention, which is an apparatus for performing a Hall effect measurement of a time-varying magnetic field. This example includes a Hall effect sensor 102 and an electrical source 104 configured to drive applied current through the Hall effect sensor. In this example, the applied current is shown as flowing from source 104 to ground through Hall effect sensor 102 in the x direction, and the frequency of this applied current is θ. Source 104 can be a current source or it can be a voltage source appropriately configured to provide the applied current to Hall effect sensor 102. We assume the magnetic field is in the z direction on this figure.

In this example, the Hall voltage is measured between points in Hall effect sensor 102 that are separated in the y direction as shown, and there are several contributions to this Hall voltage. More specifically, Hall effect sensor 102 provides a first signal proportional to a product of applied current and the time-varying magnetic field. This first signal is the useful Hall signal. Hall effect sensor 102 also provides a second signal proportional to the applied current and independent of the time-varying magnetic field. This second signal is an undesirable parasitic signal, and is usually referred to as the offset signal. In practice, Hall effect sensor 102 usually also provides a third signal proportional to a time derivative of the time-varying magnetic field and independent of the applied current. This third signal is also an undesirable parasitic signal, and is usually referred to as the induced signal.

As described in greater detail below, the frequencies of the second and third signals differ from the frequency of the first signal for time-varying magnetic fields. One simple example of this is where the magnetic field has a single frequency ω. The resulting frequencies of the first, second and third signals are θ±ω, θ, and ω, respectively.

The output of Hall effect sensor 102 is connected to an electrical spectrum analyzer 106. Spectrum analyzer 106 is configured to provide an output Hall effect spectrum from the Hall effect sensor in a frequency range from f1 to f2 with $\theta < f1 < f2$, as described in greater detail below in section B4. For now we note that the frequency range from f1 to f2 includes $\theta+\omega$, as shown.

The result of this scheme is to improve magnetic field sensing accuracy by separating the frequencies of the useful Hall signal from the undesirable offset and inductive signals.

Various applications are possible, including but not limited to measuring magnetic fields in: automotive engines, airplane engines, fusion reactors, electrical power plants, electric motors and power electronics B) Examples B1) Theory For DC magnetic fields, the voltage output of a Hall-effect sensor is:

$$V_{OUT} = \frac{I(B+\alpha)}{qn_s} \quad (1)$$

where $V_{OUT}$ is the measured voltage, I is the current driving the Hall-effect sensor, B is the external magnetic field, $\alpha$ is the offset, q is the electronic charge constant and $n_s$ is the sheet density of electrons. This equation is the Hall-effect voltage equation, modified to include the offset.

There are applications in which the magnetic field frequency is unknown, or varies over time, such as in electric engines and turbines. In such cases, the current driving frequency can be set at a value $\theta$, while the magnetic field frequency is unknown at $\omega$. The phase mismatch is captured by $\varphi$:

$$I = I_0 \sin(\theta t)$$

$$B = B_0 \sin(\omega t + \varphi)$$

Substituting above equations into (1), and adding the dB/dt inductive term gives:

$$V_{OUT} = \frac{I_0 \sin(\theta t)(B_0 \sin(\omega t + \varphi) + \alpha)}{qn_s} + \beta \frac{dB}{dt}$$

$$= \frac{I_0 B_0 \sin(\theta t)\sin(\omega t + \varphi) + \alpha I_0 \sin(\theta t)}{qn_s} + \beta \omega B_0 \cos(\omega t + \varphi)$$

$$= \frac{-I_0 B_0}{2qn_s}[\cos(\theta t + \omega t + \varphi) - \cos(\theta t - \omega t - \varphi)] + \frac{\alpha I_0 \sin(\theta t)}{2qn_s} + \beta \omega B_0 \cos(\omega t + \varphi)$$

Using the product to sum identity of sine and cosine, $$V_{OUT} = \frac{-I_0 B_0 \cos((\theta + \omega)t + \varphi)}{2qn_s} + \frac{I_0 B_0 \cos((\theta - \omega)t - \varphi)}{2qn_s} + \frac{\alpha I_0 \sin(\theta t)}{qn_s} + \beta \omega B_0 \cos(\omega t + \varphi)$$

The above equation has the offset $\alpha$ at frequency $\theta$, the induced magnetic field signal $\beta$ at frequency $\omega$, and the useful Hall signal $I_0 B_0$ at frequency $\theta \pm \omega$. The phase mismatch $\varphi$ does not factor into the magnitude of any of the above terms. This technique enables the measurement of the signal at frequencies different from the noise (offset and induced voltage), thus allowing bandpass filtering techniques to isolate signal from the noise.

B2) Simulation

To illustrate the above equations, we simulated the $\theta \pm \omega$ technique using python. The input magnetic field frequency $\omega$ was held constant at 500 Hz, the current driving frequency $\theta$ was held constant at 300 Hz, and a phase mismatch of 35° was set. The magnetic field ($B_0$) was varied between 0 to 6 mT. The measured signal was deconvoluted using fast Fourier transform and frequencies of 300 Hz, 500 Hz and 800 Hz were isolated. The results are displayed in FIG. 2.

Figure 2:
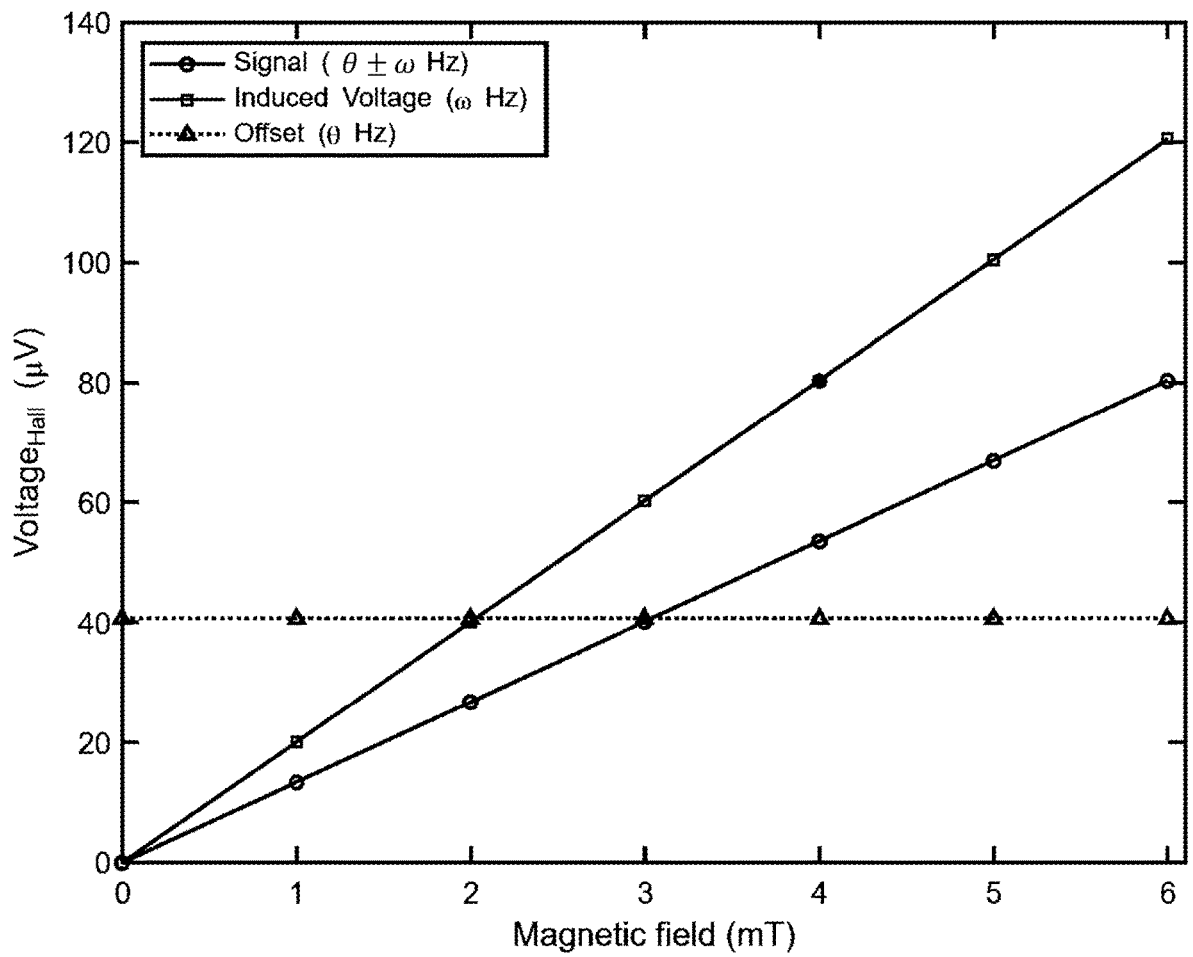
FIG. 2 shows simulated responses for Hall, offset and inductive signals, as magnetic field is varied.

FIG. 2 shows the three components in the equation measured at 300 Hz ($\theta$), 500 Hz ($\omega$) and 800 Hz ($\omega+\theta$). The circles show the portion of the output voltage (amplitude) due to the external magnetic field $$\frac{-I_o B_o \cos((\theta + \omega)t + \varphi)}{2qn_s}$$

as $B_o$ is varied, the squares show the portion of the output due to the induced magnetic field $\beta B_o \omega \cos(\omega t + \varphi)$, and the triangles and dotted line show the portion of the output voltage due to the offset $$\frac{I_o \alpha \sin(\theta t)}{qn_s}.$$

The offset, $\alpha$, was held constant in the simulation at 21 µV and the magnitude of the induced voltage, $\beta$, was held at 1 V·s/mT. Sheet density, $n_s$, was $2.1 \times 10^{13}$ cm$^{-2}$, as measured experimentally for the Hall-effect sensor at room temperature.

As the external magnetic field is increased, the offset measured at 300 Hz ($\theta$) has no change, whereas the induced magnetic field measured at 500 Hz ($\omega$) and the Hall signal measured at 800 Hz ($\omega+\theta$) increase linearly with increasing external magnetic field.

B3) Experiment and Discussion

The experimental setup for the $\theta \pm \omega$ technique includes a waveform generator to drive the current, an AC solenoid to generate the magnetic field and a lock-in amplifier to measure the Hall voltage.

The experiment was conducted in Earth's magnetic field. The current driving frequency was independently controlled by the waveform generator and the magnetic field frequency was controlled by the lock-in amplifier. The strength of the external magnetic field was varied using the AC current source and the Hall-effect voltage was measured using the lock-in amplifier. The magnetic field was varied between 600 Hz and 1 kHz using the lock-in amplifier, the driving current frequency was varied between 300 Hz to 1.5 kHz using the waveform generator and at 0.5 peak voltage, and the Hall-effect voltage output was measured between 700 Hz and 2.1 kHz using the lock-in amplifier. The phase difference between the driving current and magnetic field frequency was measured using Keysight Technologies EDUX1002A oscilloscope. No effect of varying phase was observed in the Hall-effect voltage output.

Figure 3:
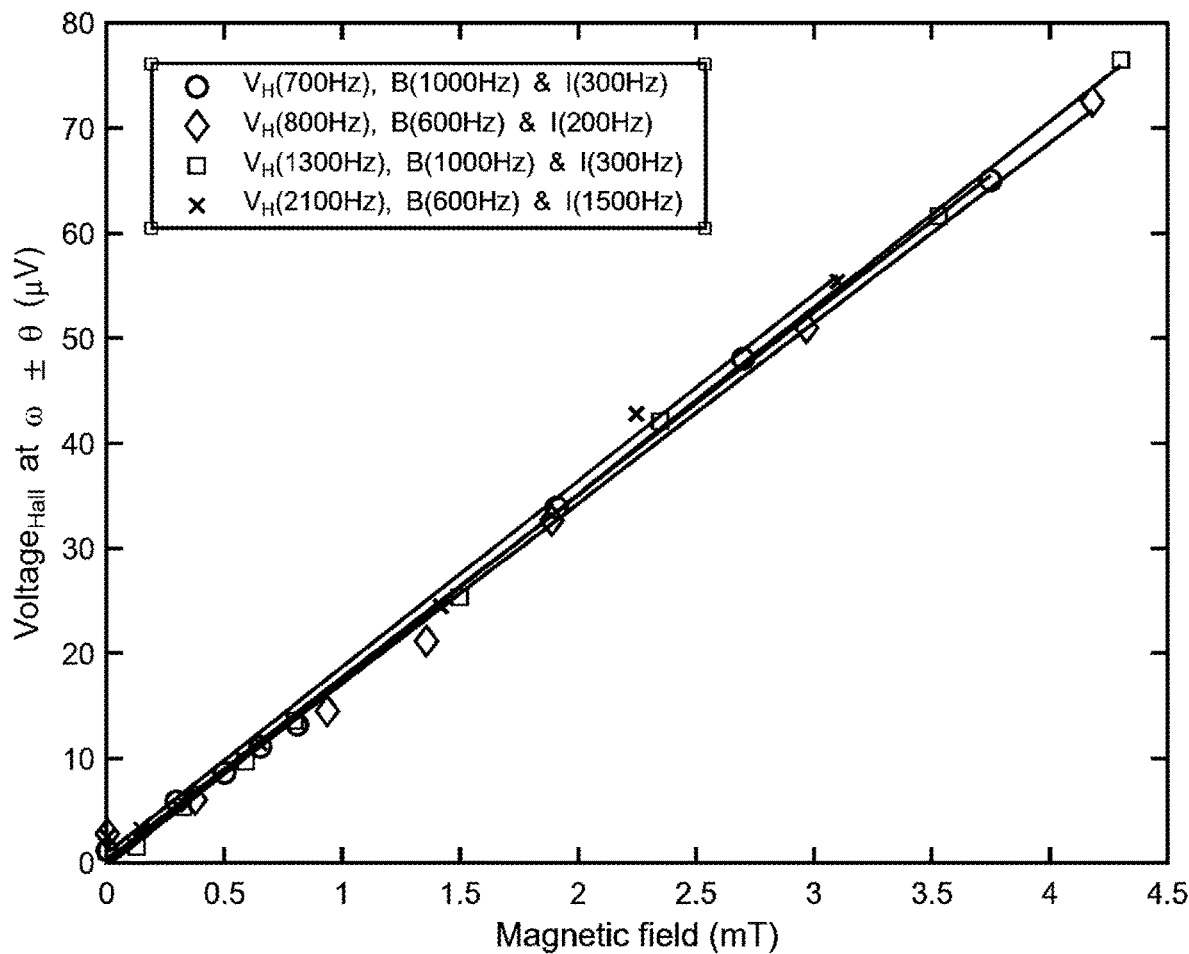
FIG. 3 shows the result of several θ±ω Hall signal measurements.

In FIG. 3 the gradient (sensitivity) is 17.39 mV/T. The theoretical gradient is calculated to be 19.33 mV/T, which is within 10% of the experimental value. The average offset measured in Earth's magnetic field is 8.37 µT and the R-squared value is 0.997. Earth's magnetic field ranges from 25-65 µT on the surface. The comparison of sensitivity and offset is captured in Table 1.

TABLE 1

Comparing the sensitivity and offset of the θ ± ω and theoretical current spinning approaches.

| Technique | Average sensitivity (mV/T) | Average offset in Earth's magnetic field (μT) |
|---|---|---|
| θ ± ω | 17.39 | 8.37 |
| Theoretical with current spinning | 19.33 | 25-65 |

B4) Frequency Range Considerations

The preceding description has focused on the case of a magnetic field having a single frequency. In practice, the case of the magnetic field having a band-limited (but otherwise unknown) frequency spectrum is of interest.

Figure 4A:
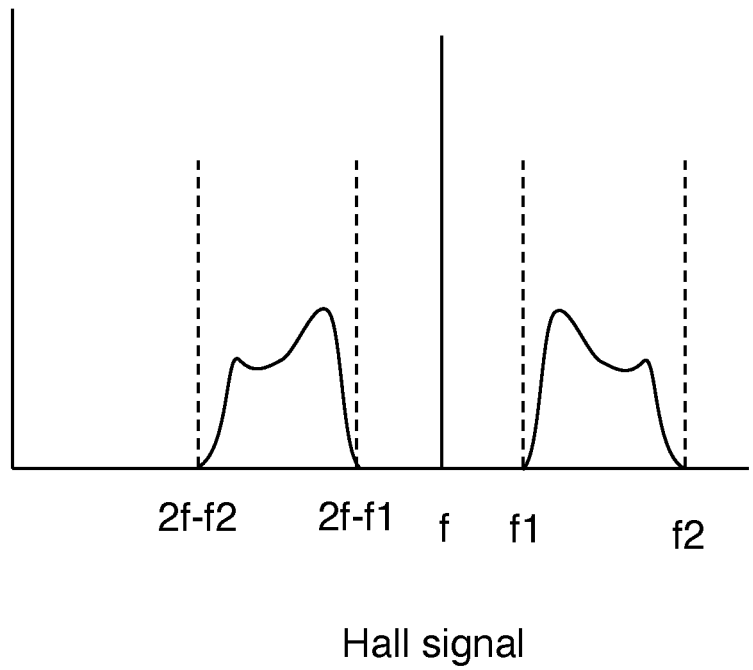
FIGS. 4A-B show frequency translation in a Hall signal of a band-limited magnetic field due to an applied current at frequency f.

FIG. 4A shows how we expect the Hall signal spectrum to look in this case, based on the considerations given above. Ideally the upper side band in the frequency range from f1 to f2 is a frequency shifted copy of the magnetic field spectrum of FIG. 4B.

Figure 5A:
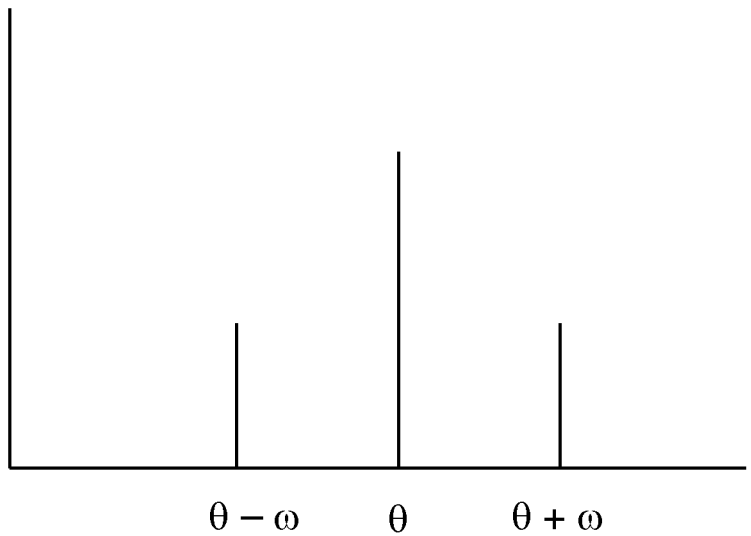
FIGS. 5A-D show a first way spectral interference can occur.
Figure 5B:
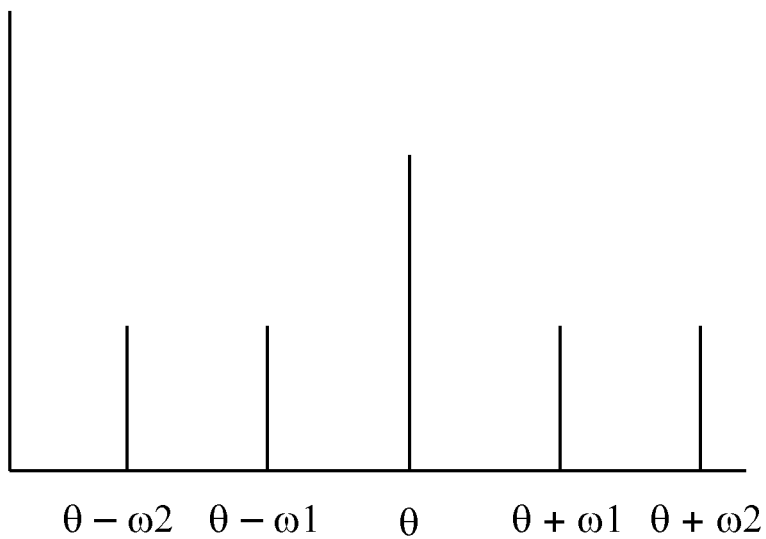

FIG. 5A shows a single-w frequency scheme as described above, and FIG. 5B shows the spectrum for two different magnetic field frequencies w1 and w2. We take w1 and w2 to be the minimum and maximum magnetic field frequencies of a band-limited magnetic field. Comparison of FIGS. 4A and 5B gives f=θ, f1=θ+ω1, and f2=θ+ω2. Thus ω1=f1−f and w2=f2−f. These relations lead to θ−ω2=2f−f2 and θ−ω1=2f−f1, completing the correspondence between FIGS. 4A and 5B.

Figure 4B:
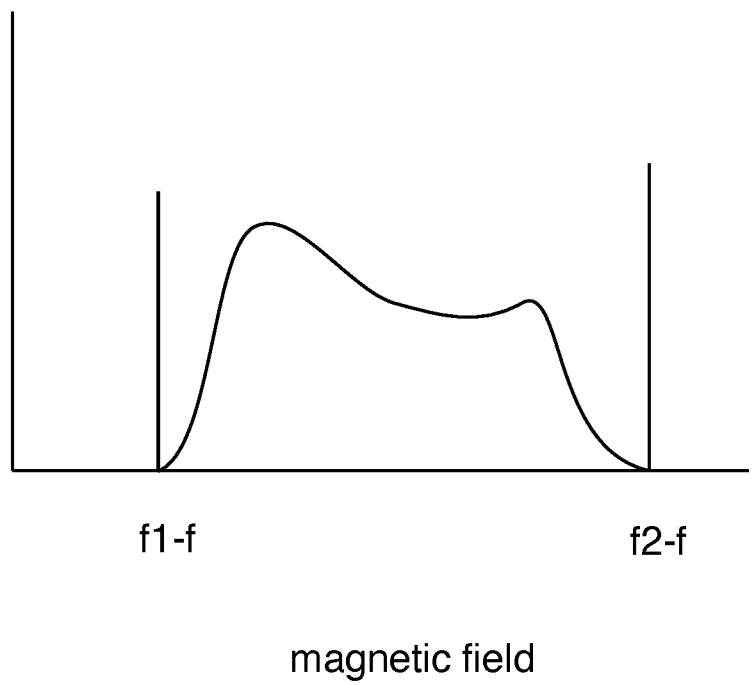
Figure 5C:
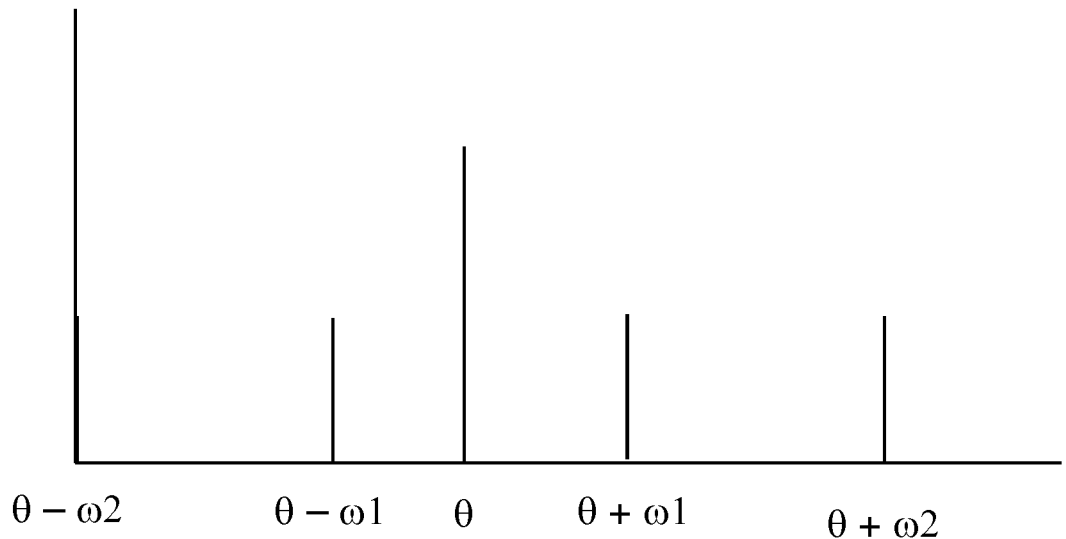
Figure 5D:
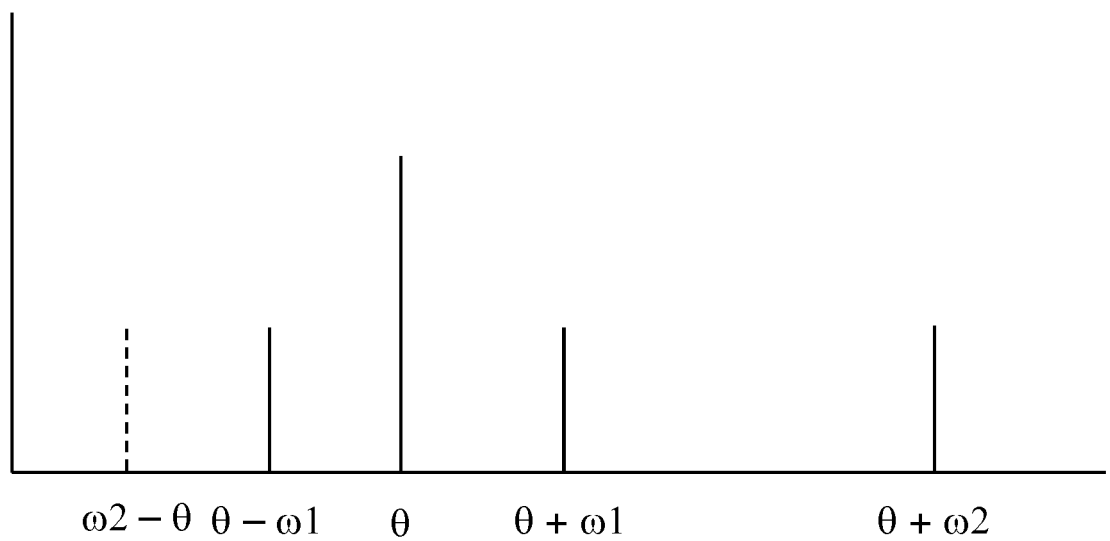

The ideal situation shown on FIGS. 4A-4B can be disrupted if undesired frequency components end up in the frequency range of interest (i.e., from f1 to f2). One way this can occur is shown on FIGS. 5C-D. FIG. 5C shows the frequency spectrum in the case that ω2=0. As shown, this leads to a DC frequency component in the lower sideband. FIG. 5D shows the situation where ω2 is further increased. Here it is seen that a lower sideband frequency component ω2−θ (dashed line) increases as ω2 increases. This will interfere with the upper sideband unless we require ω2−θ to be less than θ+ω1. Thus, ω2−ω1<2θ, or in the notation of FIG. 4A, f2−f1<2f.

Figure 6:
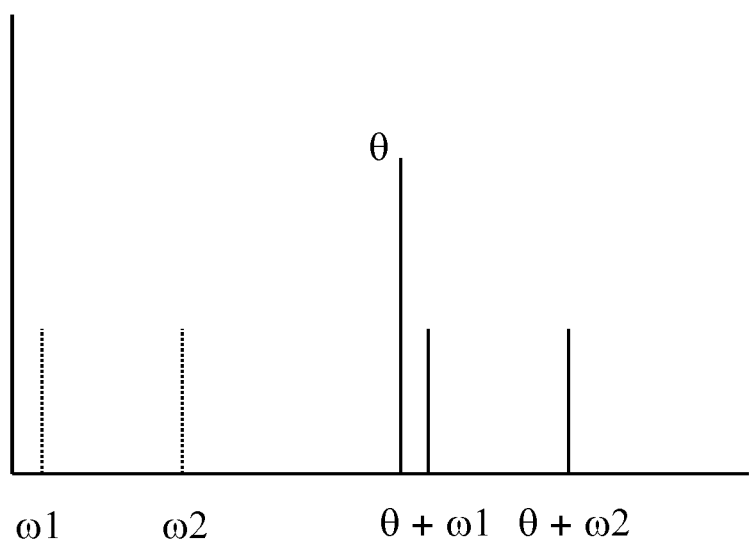
FIG. 6 shows a second way spectral interference can occur.

In cases where the inductive signal from the magnetic field is significant, there is a second condition on the frequencies that should be imposed to prevent spectral interference. FIG. 6 shows the relevant spectra. A band-limited magnetic field as described above will have an inductive signal with spectrum from ω1 to ω2 as shown by the dotted lines on FIG. 6. The requirement that this signal not spectrally interfere with the Hall signal spectrum from θ+ω1 to θ+ω2 leads to the condition ω2<θ+ω1. Equivalently, ω2−ω1<θ, or in the notation of FIG. 4A, f2−f1<f.

B5) Lower Sideband

The preceding considerations have assumed the upper sideband is being used for the Hall signal. It is also possible, in principle, to use the lower sideband instead, but this is not preferred for several reasons. The main reason is that it is easier to get clean frequency separations between the Hall signal and the undesired signals in the upper sideband than in the lower sideband.

The invention claimed is:

1. Apparatus for performing a Hall effect measurement on a time-varying magnetic field, the apparatus comprising:
   a Hall effect sensor, wherein the Hall effect sensor provides a first signal proportional to a product of applied current and the time-varying magnetic field, and wherein the Hall effect sensor provides a second signal proportional to the applied current and independent of the time-varying magnetic field;
   an electrical source configured to drive the applied current through the Hall effect sensor, wherein a frequency of the applied current is f;
   an electrical spectrum analyzer configured to provide an output Hall effect spectrum from the Hall effect sensor in a frequency range from f1 to f2 with f<f1<f2;
   wherein f2−f1<2f, whereby the output Hall effect spectrum provides a measurement of a magnetic field spectrum in a magnetic field frequency range from f1−f to f2−f;
   wherein the output Hall effect spectrum has improved magnetic field sensing accuracy due to suppression of the second signal by separating frequencies of the second signal and the output Hall effect spectrum.

2. The apparatus of claim 1, wherein f2−f1<f.

3. The apparatus of claim 1,
   wherein the Hall effect sensor provides a third signal proportional to a time derivative of the time-varying magnetic field and independent of the applied current;
   wherein the output Hall effect spectrum has improved magnetic field sensing accuracy due to suppression of the third signal by separating frequencies of the third signal and the output Hall effect spectrum.

4. The apparatus of claim 3, wherein f2−f1<f.

5. The apparatus of claim 1, wherein the apparatus is configured to measure a magnetic field in a system selected from the group consisting of: automotive engines, airplane engines, fusion reactors, electrical power plants, electric motors and power electronics.

* * * * *